United States Patent
Bohnhoff-Hlavacek et al.

(10) Patent No.: US 12,182,735 B2
(45) Date of Patent: Dec. 31, 2024

(54) QUESTER EVALUATION FOR ADDITIVE MANUFACTURING OF A VEHICLE PART

(71) Applicant: THE BOEING COMPANY, Chicago, IL (US)

(72) Inventors: Gail L. Bohnhoff-Hlavacek, Seattle, WA (US); Brent Louis Hadley, Kent, WA (US); Patrick Jan Eames, Newcastle, WA (US); Robert James Martin, Seattle, WA (US); Joseph Frank Floyd, University Place, WA (US); Chul Young Park, Snohomish, WA (US)

(73) Assignee: The Boeing Company, Chicago, IL (US)

( * ) Notice: Subject to any disclaimer, the term of this patent is extended or adjusted under 35 U.S.C. 154(b) by 1274 days.

(21) Appl. No.: 15/942,058

(22) Filed: Mar. 30, 2018

(65) Prior Publication Data
US 2019/0303782 A1     Oct. 3, 2019

(51) Int. Cl.
*G06F 16/2457* (2019.01)
*B33Y 50/00* (2015.01)
(Continued)

(52) U.S. Cl.
CPC ............. *G06N 5/048* (2013.01); *B33Y 50/00* (2014.12); *G06F 16/2457* (2019.01); *G06F 16/252* (2019.01); *G06F 30/00* (2020.01)

(58) Field of Classification Search
CPC ... B33Y 50/00; G06F 16/2457; G06F 16/252; G06F 00/00
See application file for complete search history.

(56) References Cited

U.S. PATENT DOCUMENTS

| 9,076,195 | B2 | 7/2015 | Mohammad et al. |
| 10,364,049 | B2 | 7/2019 | Floyd et al. |

(Continued)

FOREIGN PATENT DOCUMENTS

| JP | H01-277977 A | 8/1989 |
| JP | 2002312637 A | 10/2002 |

(Continued)

OTHER PUBLICATIONS

Christian Lindemann, Towards a sustainable and economic selection of part candidates for Additive Manufacturing, Rapid Prototyping Journal, vol. 21 No. 2, pp. 216-227 (Year: 2015).*

(Continued)

*Primary Examiner* — Kakali Chaki
*Assistant Examiner* — Su-Ting Chuang
(74) *Attorney, Agent, or Firm* — Yee & Associates, P.C.

(57) ABSTRACT

A system for evaluating a measure of appropriateness of additive manufacturing (AM) to manufacture a vehicle part of a vehicle is provided. The system includes a plurality of data source importers to import a plurality of datasets from a plurality of data sources to a data collection system with a composite dataset including data of the plurality of datasets. The system also includes a dataset manager system (DMS) to manage the data collection system. The system further includes a client application coupled to the DMS. The client application receives a user request for the measure of appropriateness of AM to manufacture the vehicle part of the vehicle during a lifecycle of the vehicle. In response to the user request, the client application produces the measure of appropriateness using an evaluation of a plurality of assessments on the data retrieved from the composite dataset.

21 Claims, 11 Drawing Sheets

(51) Int. Cl.
  *G06F 16/25* (2019.01)
  *G06F 30/00* (2020.01)
  *G06N 5/048* (2023.01)

(56) References Cited

U.S. PATENT DOCUMENTS

| | | | |
|---|---|---|---|
| 10,486,826 B2 | 11/2019 | Kim et al. | |
| 2002/0138316 A1* | 9/2002 | Katz | G06Q 30/0202 |
| | | | 705/7.13 |
| 2006/0265261 A1* | 11/2006 | Wetzer | G06Q 10/0631 |
| | | | 705/7.18 |
| 2009/0198509 A1* | 8/2009 | Dumoff | G06Q 30/02 |
| | | | 705/2 |
| 2015/0052000 A1 | 2/2015 | Apsley et al. | |
| 2016/0096318 A1* | 4/2016 | Bickel | B29C 64/106 |
| | | | 264/40.1 |
| 2017/0343984 A1 | 11/2017 | Czinger et al. | |
| 2018/0005197 A1 | 1/2018 | Kesler et al. | |
| 2018/0094953 A1* | 4/2018 | Colson | G06F 1/3287 |
| 2018/0232676 A1* | 8/2018 | Hlasyszyn | G06Q 30/0633 |
| 2019/0102810 A1 | 4/2019 | Floyd et al. | |

FOREIGN PATENT DOCUMENTS

| | | |
|---|---|---|
| JP | 2012510390 A | 5/2012 |
| JP | 2017130232 A | 7/2017 |

OTHER PUBLICATIONS

2016_Vahabli_Application of an RBF Neural Network for FDM Parts' Surface Roughness Prediction for Enhancing Surface Quality International Journal of Precision Engineering and Manufacturing vol. 17, No. 12, pp. 1589-1603 (Year: 2016).*

Yahaya Yusuf, Enterprise information systems project implementation: A case study of ERP in Rolls-Royce Int. J. Production Economics 87 (2004) 251-266 (Year: 2004).*

Christian Lindemann et al: "Towards a sustainable and economic selection of part candidates for additive manufacturing", Rapid Prototyping Journal, vol. 21, No. 2, Mar. 16, 2015, pp. 216-227.

Brett P. Conner et al: "Making sense of 3-D printing: Creating a map of additive manufacturing products and services", Additive Manufacturing, vol. 1-4, Sep. 6, 2014, pp. 64-76.

Anonymous: "Data collection system—Wikipedia", Aug. 28, 2017 (Aug. 28, 2017), XP055612083, Retrieved from the Internet: URL:https://en.wikipedia.org/w/index.php?title=Data collection -system &oldid=797646062.

Extended European Search Report for European Application No. 19163613.3-1224; mailed Aug. 22, 2019.

Huang, Y., et al. Additive Manufacturing: Current State, Future Potential, Gaps and Needs, and Recommendations. Journal of Manufacturing Science and Engineering. vol. 137 / 014001-1—Feb. 10, 2015. 10 pages. Retrieved from the Internet <URL: http://manufacturingscience.asmedigitalcollection.asme.org/> <DOI: 10.1115/1.4028725>.

European Office Action dated Aug. 4, 2021 in the corresponding European Patent Application No. 19163613.3.

Lindemann, Christian et al., "Towards a sustainable and economic selection of part candidates for Additive Manufacturing", 2014 International Solid Freeform Fabrication Symposium, the United States, University of Texas at Austin, 2014, p. 935-950.

National Intellectual Property Administration, PRC, Office Action, dated Oct. 31, 2024, regarding CN Application No. 2019102530749, 13 pages.

Office Action, dated Oct. 22, 2024, regarding KR Application No. 10-2019-0035989, 7 pages.

* cited by examiner

| PART DETAILS (601) | AM PART FABRICATION (602) | COST / SCHEDULE BENEFIT EVALUATION (603) | AM APPROPRIATENESS RANKING RELEVANCY (604) |
|---|---|---|---|
| PART NUMBER | AM PROCESSING CODE AVAILABLE (Y/N) | COST SAVINGS | |
| CURRENT FAB DETAILS | | | |
| SIMILAR PART NUMBER | MATERIALS AVAILABLE | SCHEDULE SAVINGS | |
| AM PART FAB DETAILS | AM EQUIPMENT AVAILABLE | | |

FIG. 6

QUESTER EVALUATION FOR ADDITIVE MANUFACTURING OF A VEHICLE PART

TECHNOLOGICAL FIELD

The present disclosure relates generally to additive manufacturing of a vehicle part, and in particular, to evaluating a measure of appropriateness of additive manufacturing (AM) of a vehicle part.

BACKGROUND

Additive manufacturing, sometimes also referred as 3D printing or 3D fabrication, includes a process of joining materials to make objects from 3D model data, usually layer by layer. Generally, additive manufacturing uses a computer, 3D modeling software (Computer Aided Design or CAD), machine equipment and layering material. Once a CAD model is produced, the machine equipment reads-in data from the CAD model and adds successive layers of liquid, powder, sheet material or other constituent(s), in a layer-upon-layer fashion to fabricate a corresponding 3D object.

Additive manufacturing can be utilized to manufacture vehicle parts of vehicles. However, the decision to manufacture vehicle parts by additive manufacturing, instead of using alternative manufacturing processes and materials, requires that the manufacturer, MRO (maintenance, repair and overhaul) organization, designer, operator or supplier to take into account a number of factors including technical, product and economic factors.

Current available methods for deciding whether to use additive manufacturing, such as utilizing engineering tradespaces or technical literature fail to take into account whether the vehicle part can be fabricated with AM to meet the engineering requirements, and secondly, whether it is appropriate to use AM-based manufacturing for the particular application and context of the vehicle. Further, if the preliminary assessment suggests that it can be done by AM, now the additional question becomes, should it be done? In other words, in the context of a vehicle application; such as the specific airplane application where there are different airplane models, life-cycle phases, attributes, and usage, which is more appropriate—AM-fabrication or an alternative fabrication method?

Therefore, it would be desirable to have a system and method that takes into account at least some of the issues discussed above, as well as other possible issues.

BRIEF SUMMARY

Example implementations of the present disclosure are directed to evaluating a measure of appropriateness of additive manufacturing to manufacture a vehicle part of a vehicle, which addresses some of the above factors, determines suitable vehicle parts for utilizing additive manufacturing, and defines manufacturing processes to produce the suitable vehicle parts via additive manufacturing. Example implementations are directed to a fixed or portable electronic computing system, and corresponding method and computer-readable medium to evaluate a measure of appropriateness of additive manufacturing to manufacture a vehicle part of a vehicle. Example implementations can implement additive manufacturing relative to vehicle frames, certifications or requirements. Utilizing additive manufacturing to manufacture vehicle parts can provide low-cost and high-quality vehicle parts throughout the lifecycle of the vehicle. Utilizing additive manufacturing to manufacture vehicle parts can also offer the advantage of eliminating many of the constraints of part manufacturing and can reduce costs by eliminating reorder lead time (ROLT) and minimum lot-size requirements, by enabling just-in-time part manufacturing by the end-user at their facility, and by reducing part inventory requirements.

The present disclosure thus includes, without limitation, the following example implementations.

Some example implementations provide a system for evaluating a measure of appropriateness of additive manufacturing (AM) to manufacture a vehicle part of a vehicle, the system comprising: a plurality of data source importers configured to import a plurality of datasets from a respective plurality of data sources to a data collection system with a composite dataset including data of the plurality of datasets; a dataset manager system (DMS) configured to manage the data collection system with the composite dataset; and a client application coupled to the DMS and configured to receive a user request for the measure of appropriateness of AM to manufacture the vehicle part of the vehicle during a lifecycle of the vehicle, the client application being configured to interpret the user request to produce a query executable by the DMS to retrieve data of the composite dataset from the data collection system, the client application also including a plurality of quester modules configured to perform a plurality of assessments on the data retrieved from the composite dataset and an evaluation module configured to produce the measure of appropriateness using an evaluation of the plurality of assessments; wherein the client application is configured to produce a graphical user interface through which the client application is configured to receive the user request, and through which the client application is configured to display a report including at least the measure of appropriateness.

In some example implementations of the system of any preceding example implementation, or any combination of preceding example implementations, the composite dataset includes at least a set of parameters for the plurality of assessments and part identification information that describes vehicle parts of the vehicle including (at least) part numbers, illustrated parts catalogue, and locations of the vehicle parts on the vehicle, and wherein the client application being configured to interpret the user request includes being configured to interpret the user request to produce the query that identifies the vehicle part based on the part identification information, the query being executable by the DMS to retrieve data of the composite dataset according thereto, and the evaluation module being configured to produce the measure of appropriateness includes being configured to produce the measure of appropriateness using the set of parameters.

In some example implementations of the system of any preceding example implementation, or any combination of preceding example implementations, wherein the plurality of data source importers being configured to import the plurality of datasets includes being configured to import the plurality of datasets from the respective plurality of data sources including data sources for vehicle operators, vehicle manufacturers, part designers, material manufacturers, part fabricators, equipment designers/makers, part suppliers, maintenance providers, repair providers, over-haulers, part designers, post-market suppliers, and retrofitters.

In some example implementations of the system of any preceding example implementation, or any combination of preceding example implementations, wherein the client application being configured to receive the user request includes being configured to receive the user request including a classification of the plurality of assessments from classifications of the plurality of assessments including a first classification for routine assessments indicating a predefined selection of the plurality of assessments, or a second classification or a third classification for conditional assessments indicating a selection of the plurality of assessments based on respectively a condition or event of the vehicle part, and wherein the evaluation module being configured to produce the measure of appropriateness includes being configured to produce the measure of appropriateness further according to the first classification, the second classification or the third classification in the user request.

In some example implementations of the system of any preceding example implementation, or any combination of preceding example implementations, wherein the client application being configured to receive the user request includes being configured to receive the user request indicating a selection of the plurality of assessments from a group including a larger plurality of assessments that are available to produce the measure of appropriateness.

In some example implementations of the system of any preceding example implementation, or any combination of preceding example implementations, wherein the plurality of assessments includes one or more of a similarity assessment of similarity of the vehicle part with other manufactured vehicle parts, and an AM adaptability assessment and a part fabrication assessment of technical capability of utilizing AM to manufacture the vehicle part.

In some example implementations of the system of any preceding example implementation, or any combination of preceding example implementations, wherein the measure of appropriateness includes a suitability of utilizing AM to manufacture the vehicle part, the suitability being indicated by a relevancy index based on the plurality of assessments.

Some example implementations provide a method of evaluating a measure of appropriateness of AM to manufacture a vehicle part of a vehicle, the method comprising: importing a plurality of datasets from a respective plurality of data sources to a data collection system with a composite dataset including data of the plurality of datasets; receiving a user request for the measure of appropriateness of AM to manufacture the vehicle part of the vehicle during a lifecycle of the vehicle; interpreting the user request to produce a query executable by a DMS managing the data collection system to retrieve data of the composite dataset from the data collection system; performing a plurality of assessments using a plurality of quester modules on the data retrieved from the composite dataset; producing the measure of appropriateness using an evaluation of the plurality of assessments; producing a graphical user interface; and displaying a report including at least the measure of appropriateness using the graphical user interface.

Some example implementations provide a computer-readable storage medium for evaluating a measure of appropriateness of AM to manufacture a vehicle part of a vehicle, the computer-readable storage medium being non-transitory and having computer-readable program code stored therein that in response to execution by a processor, causes a computer system to at least: import a plurality of datasets from a respective plurality of data sources to a data collection system with a composite dataset including data of the plurality of datasets; receive a user request for the measure of appropriateness of AM to manufacture the vehicle part of the vehicle during a lifecycle of the vehicle; interpret the user request to produce a query executable by a DMS managing the data collection system to retrieve data of the composite dataset from the data collection system; perform a plurality of assessments using a plurality of quester modules on the data retrieved from the composite dataset; produce the measure of appropriateness using an evaluation of the plurality of assessments; and display a report including at least the measure of appropriateness using the graphical user interface.

These and other features, aspects, and advantages of the present disclosure will be apparent from a reading of the following detailed description together with the accompanying drawings, which are briefly described below. The present disclosure includes any combination of two, three, four or more features or elements set forth in this disclosure, regardless of whether such features or elements are expressly combined or otherwise recited in a specific example implementation described herein. This disclosure is intended to be read holistically such that any separable features or elements of the disclosure, in any of its aspects and example implementations, should be viewed as combinable unless the context of the disclosure clearly dictates otherwise.

It will therefore be appreciated that this Brief Summary is provided merely for purposes of summarizing some example implementations so as to provide a basic understanding of some aspects of the disclosure. Accordingly, it will be appreciated that the above described example implementations are merely examples and should not be construed to narrow the scope or spirit of the disclosure in any way. Other example implementations, aspects and advantages will become apparent from the following detailed description taken in conjunction with the accompanying drawings which illustrate, by way of example, the principles of some described example implementations.

BRIEF DESCRIPTION OF THE DRAWING(S)

Having thus described example implementations of the disclosure in general terms, reference will now be made to the accompanying drawings, which are not necessarily drawn to scale, and wherein:

FIG. 6 illustrates using the GUI to display the report including the measure of appropriateness, according to various example implementations;

DETAILED DESCRIPTION

Figure 1:
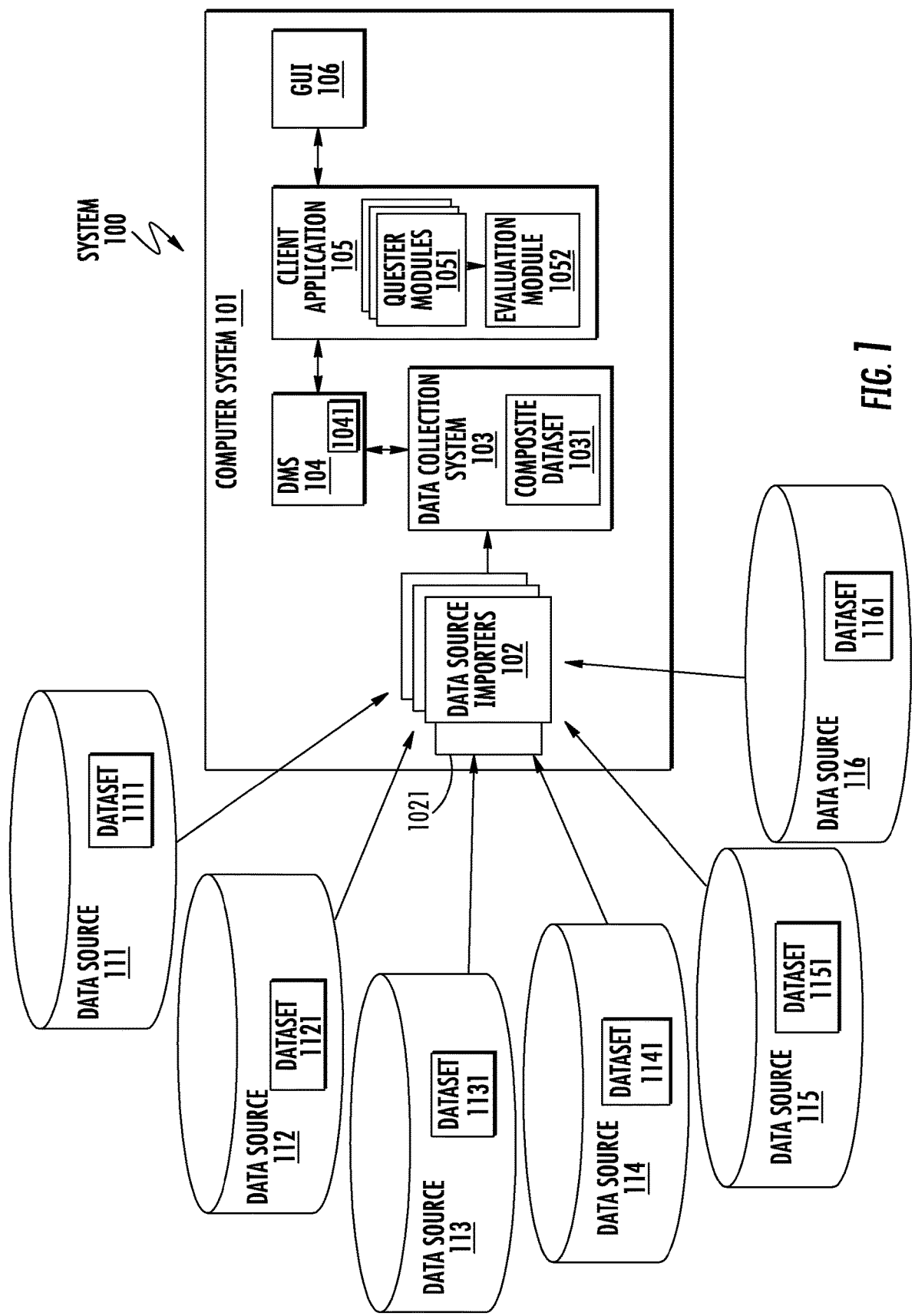
FIG. 1 illustrates a system for evaluating a measure of appropriateness of AM to manufacture a vehicle part of a vehicle, according to example implementations of the present disclosure.

Some implementations of the present disclosure will now be described more fully hereinafter with reference to the accompanying drawings, in which some, but not all implementations of the disclosure are shown. Indeed, various implementations of the disclosure may be embodied in many different forms and should not be construed as limited to the implementations set forth herein; rather, these example implementations are provided so that this disclosure will be thorough and complete, and will fully convey the scope of the disclosure to those skilled in the art. For example, unless otherwise indicated, reference something as being a first, second or the like should not be construed to imply a particular order. Also, something may be described as being above something else (unless otherwise indicated) may instead be below, and vice versa; and similarly, something described as being to the left of something else may instead be to the right, and vice versa. Like reference numerals refer to like elements throughout.

Example implementations of the present disclosure are generally directed to AM of a vehicle part of a vehicle, and in particular, to evaluating a measure of appropriateness of AM of a vehicle part of a vehicle. The vehicle may include, but not limited to an aircraft, a spacecraft, an automobile or a marine vessel.

Figure 8:
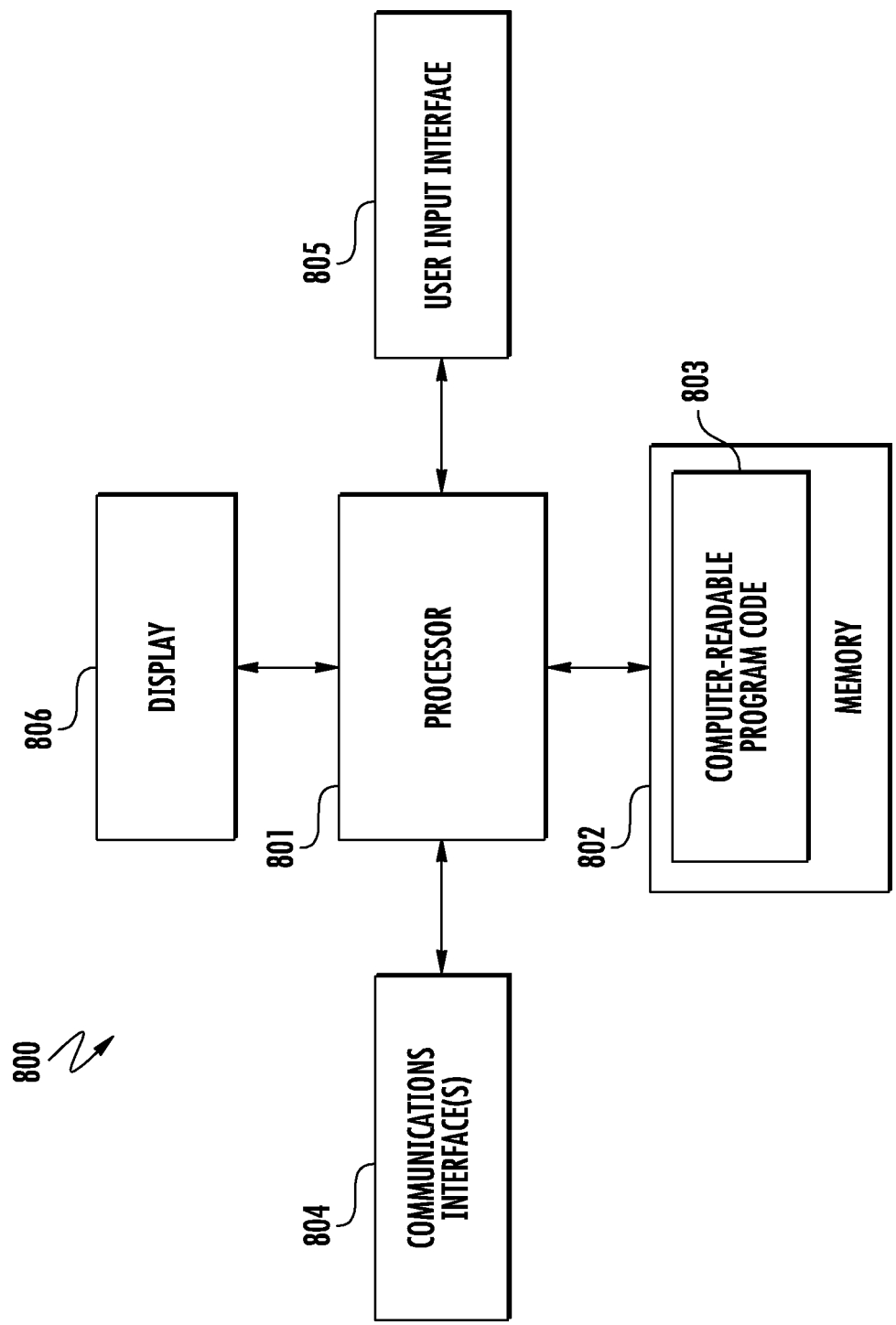
FIG. 8 illustrates an apparatus according to some example implementations.

FIG. 1 illustrates a system 100 for evaluating a measure of appropriateness of AM to manufacture a vehicle part of a vehicle, according to example implementations of the present disclosure. The system includes a computer system 101 with a processor and a memory (as shown in FIG. 8 below) storing executable instructions that, in response to execution by the processor, cause the computer system to evaluate a measure of appropriateness of AM to manufacture a vehicle part of a vehicle.

In some examples, the computer system 101 includes a plurality of data source importers 102 configured to import a plurality of datasets 1111, 1121, 1131, 1141, 1151 and 1161 from a respective plurality of data sources 111-116 to a data collection system 103 with a composite dataset 1031 including data of the plurality of datasets. The data sources may provide datasets that are digital or non-digital. In one example, the data sources importers can be coupled to a pre-processor 1021 to convert non-digital data to digital data. In one example, the data collection system 103 may include a database.

In one example, the data source importers 102 may include a software tool to run program code for importing or extracting the plurality of datasets 1111, 1121, 1131, 1141, 1151 and 1161 from the plurality of data sources 111-116 to the data collection system 103. The data source importers 102 may require a data source preprocessor 1021 to convert the data to a form readable to the data source importer 102. For example, a printed paper drawing may need to be digitized. The data sources 111-116 may be available from the vehicle operator or from the vehicle manufacturer, e.g., from manuals or documents published by the vehicle operator or the vehicle manufacturer. In some examples, then, the plurality of data source importers 102 is configured to import the plurality of datasets 1111, 1121, 1131, 1141, 1151 and 1161 from the respective plurality of data sources 111-116 including data sources for vehicle operators, vehicle manufacturers, part designers, material manufacturers, part fabricators, equipment designers/makers, part suppliers, maintenance providers, repair providers, over-haulers, part designers, post-market suppliers, retrofitters, 3D printing marketplaces, or on-demand 3-D printing service provider. The data sources 111-116 may be updated regularly, e.g., monthly. In some examples, the data collection system 103 includes a composite dataset 1031 including data of the plurality of datasets 1111, 1121, 1131, 1141, 1151 and 1161 from the data sources 111-116.

Examples of suitable types of data sets include computer-aided design documents (e.g., CAD, CATDrawing, CATPart, CATProduct, CATProcess, cgr, DWG, DXF, DWF, etc.), text-based documents (e.g., ANS, ASC, DOC, DOCX, HTML, PDF, RTF, TXT, WPD, etc.), presentation documents (e.g., PDP, PPT, etc.), graphics documents (e.g., BMP, GIF, JPEG, JP2, PNG, PSD, PSP, RAW, TIFF, etc.), spreadsheet data (e.g., xlsx), video documents (e.g., AVI, MPEG, QuickTime, WMV, etc.) or the like. And still further examples of suitable types of data sets include data sets such as engineering design data, troubleshooting data, business data or the like.

Other examples of suitable types of data sets include single or collections of material properties documents, specifications, requirements, books, manuals, magazines or trade publications, articles, web pages, legal documents, screenshots, service bulletins, engineering diagrams, warranties, technical drawings, wiring diagrams or the like.

In the aircraft industry, for example, Airlines for America (A4A), formerly the Air Transport Association of America (ATA) has released a number of specifications including schema for structuring aircraft maintenance and operations documents. The ATA iSpec 2200, for example, specifies document type definitions (DTDs) for documents such as an aircraft illustrated parts catalog (AIPC), aircraft maintenance manual (AMM), aircraft recovery manual (ARM), component maintenance manual (CMM), component maintenance manual parts list (CMMIPL), consumable products manual (CPM), engine (shop) manual (EM), engine cleaning inspection and repair manual (CIR), engine illustrated parts catalog (EIPC), engine parts configuration management section (EPCM), fault reporting and fault isolation manual (FRM/FIM), flight crew operations manual (FCOM), illustrated tool and equipment manual (ITEM), intelligent graphics exchange manual (IGEXCHANGE), maintenance planning document (MPD), maintenance review board report (MRB), maintenance steering group report (MSG-3), master minimum equipment list (MMEL), non-destructive testing manual (NDT), power plant build-up manual (PPBM), power plant build-up manual illustrated parts list (PPBMIPL), production management database (PMDB), service bulletin (SB), service bulletin index (SBI), service description section (SDS), structural repair manual (SRM), system description sections (SDS), tool and equipment manual (TEM), weight and balance manual (WBM), wiring diagram manual (WM) or the like.

In some examples, the computer system 101 includes a dataset manager system (DMS) 104 configured to manage the data collection system 103 with the composite dataset 1031, and a client application 105 coupled to the DMS 104 and configured to receive a user request for the measure of appropriateness of AM to manufacture the vehicle part of the vehicle during a lifecycle of the vehicle. In one example, the DMS 104 is configured to run operations on the data requested by numerous users. In one example, the client application 105 can retrieve quester module requirements data. In one example, the quester module requirements data may include regulatory requirement data. The client application 105 is configured to interpret the user request to produce a query executable by the DMS 104 to retrieve data of the composite dataset 1031 from the data collection system 103. In one example, the client application 105 is configured to interpret the user request using quester modules based on rules and algorithms of the quester modules, as described below. In one example, the DMS 104 may include a database management system (DBMS) 1041.

In one example, if the vehicle is used in aerospace, such as an aircraft, the lifecycle of the vehicle may include phases such as concept, design/requirements modeling and simulation, prototype/test/predictions performance, qualification and certification/validation and verification, fabrication production/manufacturing/quality assurance, distribution/marketing/supply chain, customer support and services (e.g., diagnostics and data analytics), maintenance/repair/overhaul, retrofit/redesign, and end-of-life/obsolete parts replacements, among other things. The evaluation of the measure of appropriateness of AM to manufacture a vehicle part of the vehicle may be used in any of the above phases. For example, the evaluation can be used in the design phase, the manufacturing phase or the maintenance phase.

In some examples, the client application 105 also includes a plurality of quester modules 1051 and an evaluation module 1052. In one example, each of the plurality of quester modules 1051 is configured to perform a respective assessment and generate the quester module measures based on the respective assessment. In some examples, the plurality of quester modules 1051 is configured to perform a plurality of assessments on the data retrieved from the composite dataset 1031, and the evaluation module 1052 is configured to receive the quester module assessments and produce the measure of appropriateness using an evaluation of the plurality of assessments performed by the plurality of quester modules 1051. In some examples, the client application 105 is configured to produce a graphical user interface (GUI) 106 through which the client application 105 is configured to receive the user request, and through which the client application 105 is configured to display a report including at least the measure of appropriateness. Alternatively, the quester module assessments and composite assessments or evaluations datasets are exported to other computer systems, including but not limited to portable/mobile computing systems, service portals, websites, printers, process systems or tools. In one example, the client application 105 is configured to communicate with or be associated with the GUI 106.

In some examples, the composite dataset 1031 includes at least a set of parameters for the plurality of assessments and part identification information that describes vehicle parts of the vehicle including at least part numbers, an illustrated parts catalogue, and locations of the vehicle parts on the vehicle. In some examples, the client application 105 is configured to interpret the user request to produce the query that identifies the vehicle part based on the part identification information, the query being executable by the DMS 104 to retrieve data of the composite dataset 1031 according thereto. In some examples, the evaluation module 1052 is configured to produce the measure of appropriateness using the set of parameters. In one example, the set of parameters is relative to a set of requirements or rules specific to an application.

In some examples, the client application 105 is configured to receive the user request including a classification of the plurality of assessments from classifications of the plurality of assessments. The classifications of the plurality of assessments include a first classification for routine assessments indicating a predefined selection of the plurality of assessments, a second classification for conditional assessments indicating a selection of the plurality of assessments based on a condition of the vehicle part, or a third classification for conditional (non-routine) assessments indicating a selection of the plurality of assessments based on an unusual event of the vehicle part. In some examples, the evaluation module 1052 is configured to produce the measure of appropriateness further according to the first classification, the second classification or the third classification in the user request.

In some examples, the client application 105 is configured to receive the user request indicating a selection of the plurality of assessments (quester modules 1051) from a group including a larger plurality of assessments that are available to produce the measure of appropriateness.

In some examples, the plurality of assessments includes one or more of a similarity assessment (quester module 1051) of similarity of the vehicle part with other manufactured vehicle parts, and an AM adaptability assessment (quester module 1051) and a part fabrication assessment (quester module 1051) of the technical capability of utilizing AM to manufacture the vehicle part. In one example, the quester module 1051 performing the similarity assessment may compare the vehicle part with other successfully AM-manufactured vehicle parts, and an AM-appropriateness measure may be provided. In another example, the quester module performs the part fabrication assessment to measure the technical capability of utilizing AM to manufacture the vehicle part. In one example, the plurality of assessments may include AM mimic files or AM files with minimized or reduced data.

In some examples, the measure of appropriateness includes a suitability of utilizing AM to manufacture the vehicle part, the suitability being indicated by a relevancy index based on the plurality of assessment (quester module measures). For example, the relevancy index can be an integer from 0-16, where 0 indicates a lowest suitability of utilizing AM to manufacture the vehicle part and 16 indicates a highest suitability of utilizing AM to manufacture the vehicle part. The relevancy index can be a summation of nominal factors. For example, the similarity quester module measure can be a nominal factor with value 5, the AM adaptability quester module measure can be a nominal factor with value 4, and the part fabrication quester module measure can be a nominal factor with value 3. In this example, the relevancy index (the summation of the three nominal factors) is 12. In some examples, each of the nominal factors has a corresponding weight and the relevancy index is the weighted summation of the nominal factors. In one example, multiple individual relevancy indices from individual quester modules can be obtained and a composite relevancy index can be obtained based on the multiple individual relevancy indices. In one example, the suitability may indicate a likelihood of utilizing AM to manufacture the vehicle part.

In one example, the suitability of utilizing AM to manufacture the vehicle part considers factors configured in the quester modules 1051; including one or more of the following: an available computer aided design/computer aided manufacturing (CAD/CAM) file or additive manufacturing file (AMF); model based engineering (MBE) domain files or conceptual files; fabrication instructions available for the 3D manufactured part; integration of 3D manufacturing with the conventional processes; part fixturing availability; available AM feedstock materials and preprocessing systems; post processing needs, refinement requirements or repair (e.g., surface finish, shape-making); verification, validation, certification (e.g., inspection, tolerances); AM Part reliability (e.g., statistics, data analytics from previously fabricated parts); AM part quality (e.g., quality assurance expected levels); and demand or scarcity of part and related parts with similar fabrication.

In one example, the available CAD/CAM file is a 3D model. In another advantageous example, the CAD/CAM file is a 4D model that models sequences of events depicted visually on a timeline that has been populated by 3D models to represent different time elements in manufacturing, or critical paths in manufacturing, or life cycle. In another advantageous example, the CAD/CAM file is an additive manufacturing file (AMF) format. An AMF can represent one object, or multiple objects arranged in a constellation or other configuration. In another example, the CAD/CAM file is a volumetric 3D printing file using laser generated, hologram-like images onto photosensitive resin, printing a 3D shape all at the same time rather than pulling together layer by layer. In other examples, the CAD/CAM file or AMF represents the geometry specification, shape or volume information, as well as additional material about the part such as color, texture, hierarchy, compositions, metadata, formulas, compressed data, compatibility, etc.

Figure 2:
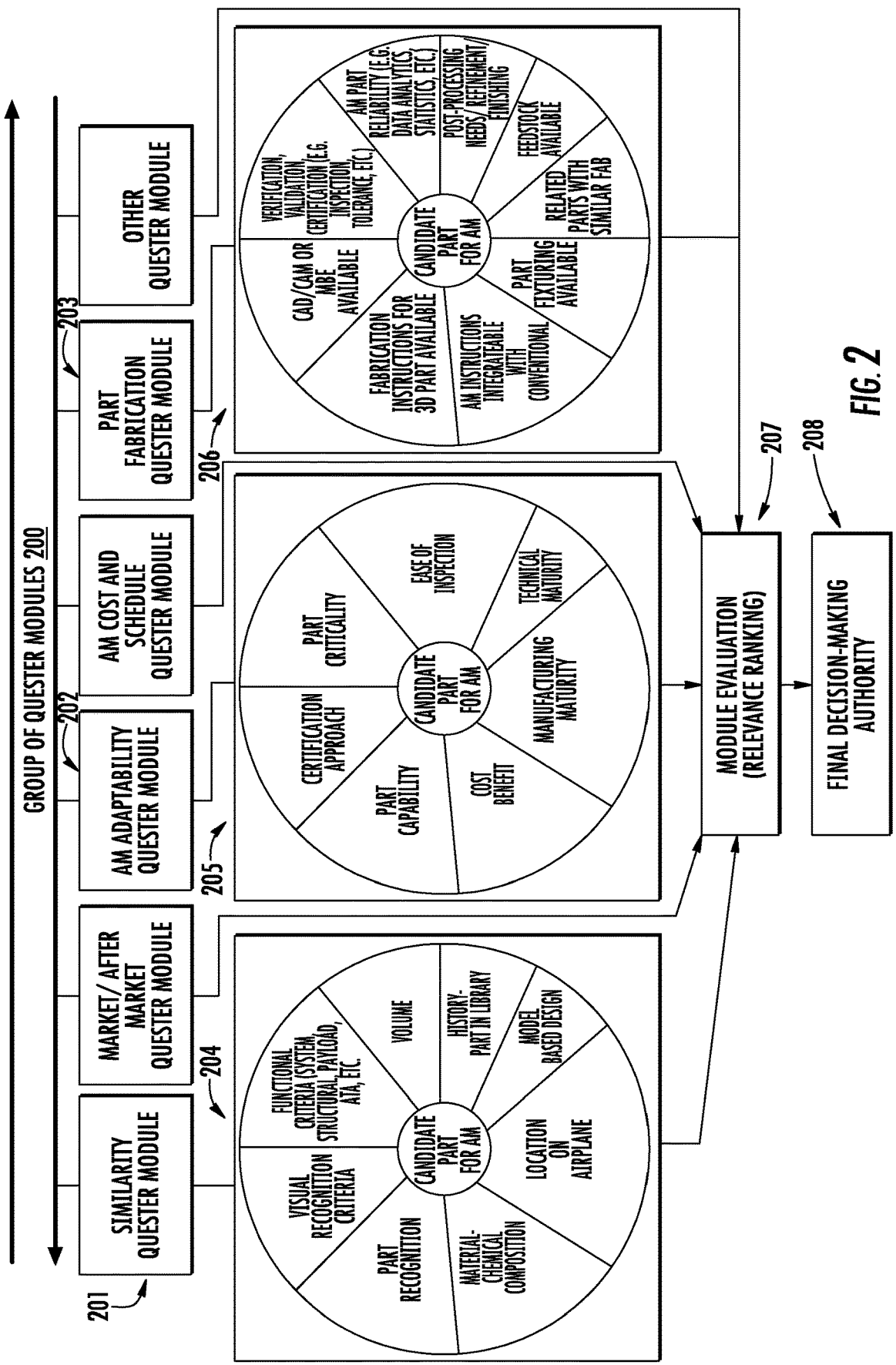
FIG. 2 illustrates a group of quester modules along with the evaluation module for evaluating a measure of appropriateness of additive manufacturing to manufacture a vehicle part of a vehicle, according to various example implementations.

FIG. 2 illustrates a group of quester modules 200, according to various example implementations. In one example, the group of quester modules corresponds to the plurality of quester modules 1051. As shown, the group of quester modules 200 includes a plurality of quester modules 1051 such as the similarity quester module 201, the AM adaptability quester module 202 and the part fabrication quester module 203. The group may also include additional quester modules such as market/after-market quester module, AM cost and schedule quester module and other quester modules. Other appropriate quester modules not shown in FIG. 2 can also be included in the group. Each quester module can perform a respective assessment to measure appropriateness of using AM to manufacture a vehicle part. The evaluation module 207 (corresponding to the evaluation module 1052) can implement an evaluation of one or more of the assessments in the group to produce the measure of appropriateness of AM to manufacture a vehicle part of the vehicle.

In one example, each quester module 1051 includes a set of assessment parameters for performing the measure or assessment. For example, the similarity quester module 201 includes a set of assessment parameters 204 such as visual recognition criteria and location on airplane. One or more of the quester module assessment parameters 204 can be used when performing the similarity assessment. Similarly, the AM adaptability quester module 202 and the part fabrication quester module 203 also include respective set of assessment parameters 205 and 206.

In one example, the similarity quester module 201 can assess the similarity of the vehicle part with other manufactured vehicle parts. The other manufactured vehicle parts may or may not be manufactured via AM. In this example, the similarity quester module 201 may evaluate the similarity of the shape, function, or material between the vehicle part and other manufactured vehicle parts. In another example, the similarity quester module 201 can assess whether the difference between the vehicle part and another vehicle part is acceptable if the vehicle part is manufactured via AM to replace the other vehicle part.

In one example, the other quester modules may include an AM part marking quester module. In this example, a current part under consideration for AM, may have a unique barcode, QR code or the like. A unique QR code can be embossed on a part during manufacturing or affixed as a label. This QR code can then link to a website to provide part manufacturing and interchangeability information, and serve as a data source by the disclosed system. For example, the data sources for interchangeability can be an Illustrated Parts Catalog (IPC), service bulletins, or a Parts Manufacturer Approval (PMA) database. The QR code quester module would assess this information and provide a measure of appropriateness.

Another quester module may include parameters related to regulatory considerations. In this example, the quester module would be used to assess the AM appropriateness relative to these regulatory requirements. The regulatory considerations quester report could be included with the manufacturing record with the part or embedded "on the part." This can allow the users or operators know who produced parts using what AM technology. Different AM technologies can produce the same shape, but the performance can vary. In another example, the other quester modules may include assessments for AM appropriateness for use by a MRO, supplier or airline use (licensing opportunity). The vehicle parts may be manufactured via AM by the MRO, Supplier or Airline.

In some examples, the assessment parameters 204, 205 and 206 can be imported to the data collection system 103 and be included in the composite dataset 1031. For example, for the similarity quester module 201, the assessment parameters can be imported from the data sources 111-116 to the data collection system 103 and be included in the composite dataset 1031. In this example, the data source 111 may include a parts catalogue, the data source 112 may include visual recognition criteria, the data source 113 may include part recognition, the data source 114 may include model-based definition (MBD) data, the data source 115 may include part volume, and the data source 116 may include location on vehicle. In one example, the data collection system 103 or the composite dataset 1031 can be included in the client application 105.

In some examples, the evaluation module 1052 is configured to produce the measure of appropriateness (e.g., the relevance ranking) based on a plurality of quester module assessments (e.g., the assessments performed by the quester modules 201-203) on the data retrieved from the composite dataset 1031, as shown at block 207. In some examples, the evaluation module is configured to produce the measure of appropriateness using one or more sets of quester module assessment parameters 204-206.

In some examples, the client application 105 is configured to receive the user request indicating a selection of the plurality of assessments performed by quester modules from a group including a larger plurality of assessments that are available to produce the measure of appropriateness. For example, the user request may indicate that the evaluation module 1052 shall perform the evaluation based on three quester module assessments 201-203 in the group 200, but shall not perform the evaluation based on other assessments in the group 200. The evaluation module may perform the evaluation based on the assessments indicated in the user request and produce the measure of appropriateness including a suitability of utilizing AM to manufacture the vehicle part, as explained above. In one example, after the evaluation module 1052 produces the measure of appropriateness, an authority, e.g., a manager, can make a final decision to decide whether to utilize AM to manufacture the vehicle part based on the measure of appropriateness, as shown at block 208. If authorized by the authority, the vehicle parts can be manufactured via AM by the MRO, Supplier or Airline.

Figure 3A:
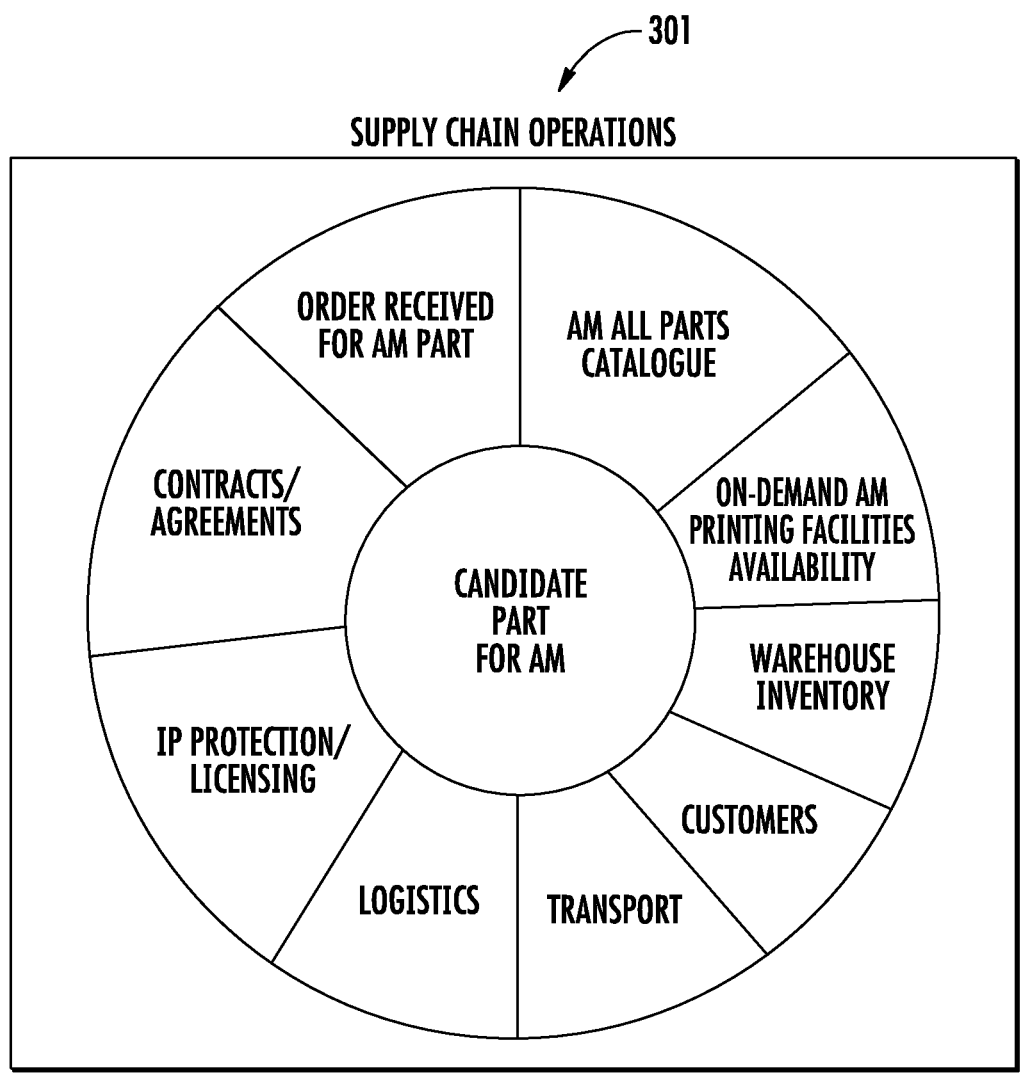
FIGS. 3A, 3B and 3C illustrate additional quester modules in the group of quester modules for evaluating a measure of appropriateness of additive manufacturing to manufacture a vehicle part of a vehicle, according to various example implementations.
Figure 3B:
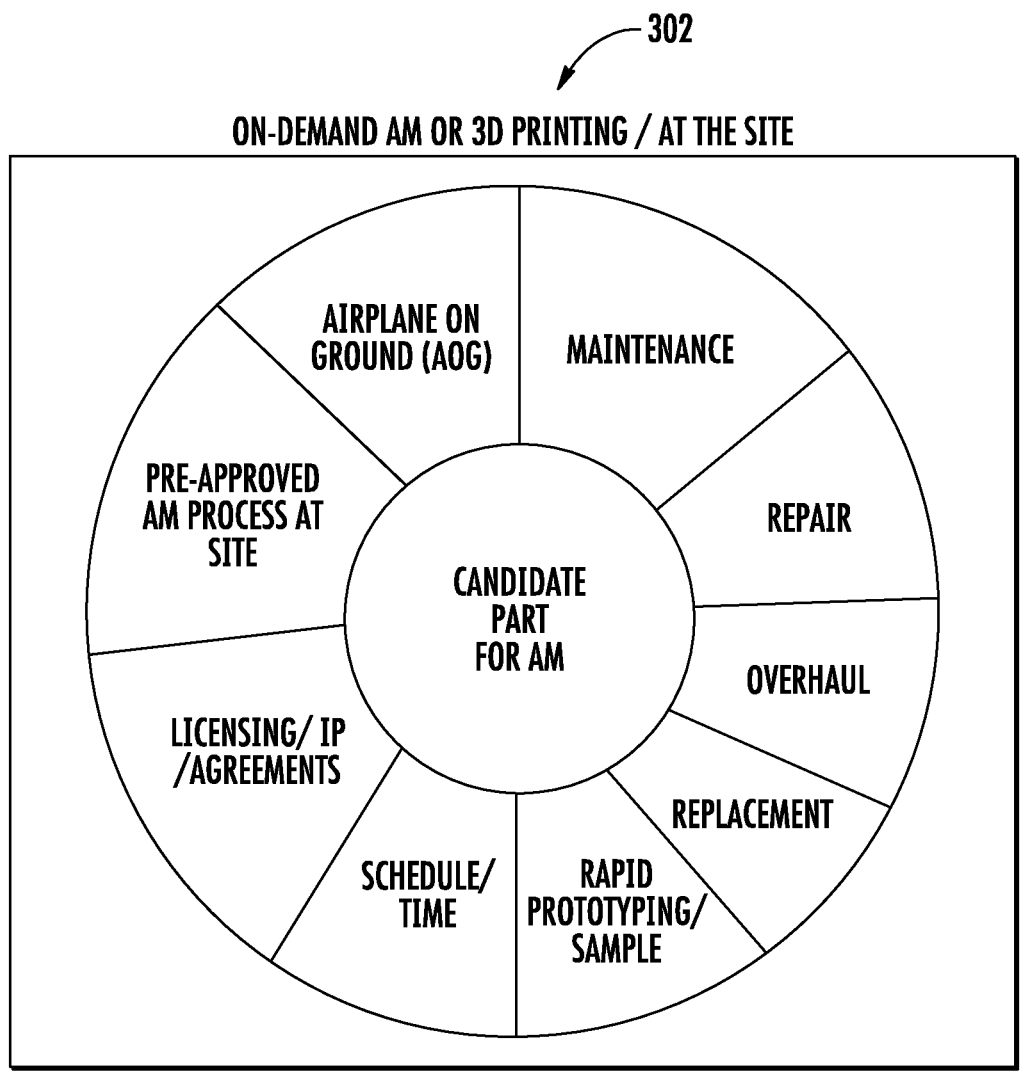
Figure 3C:
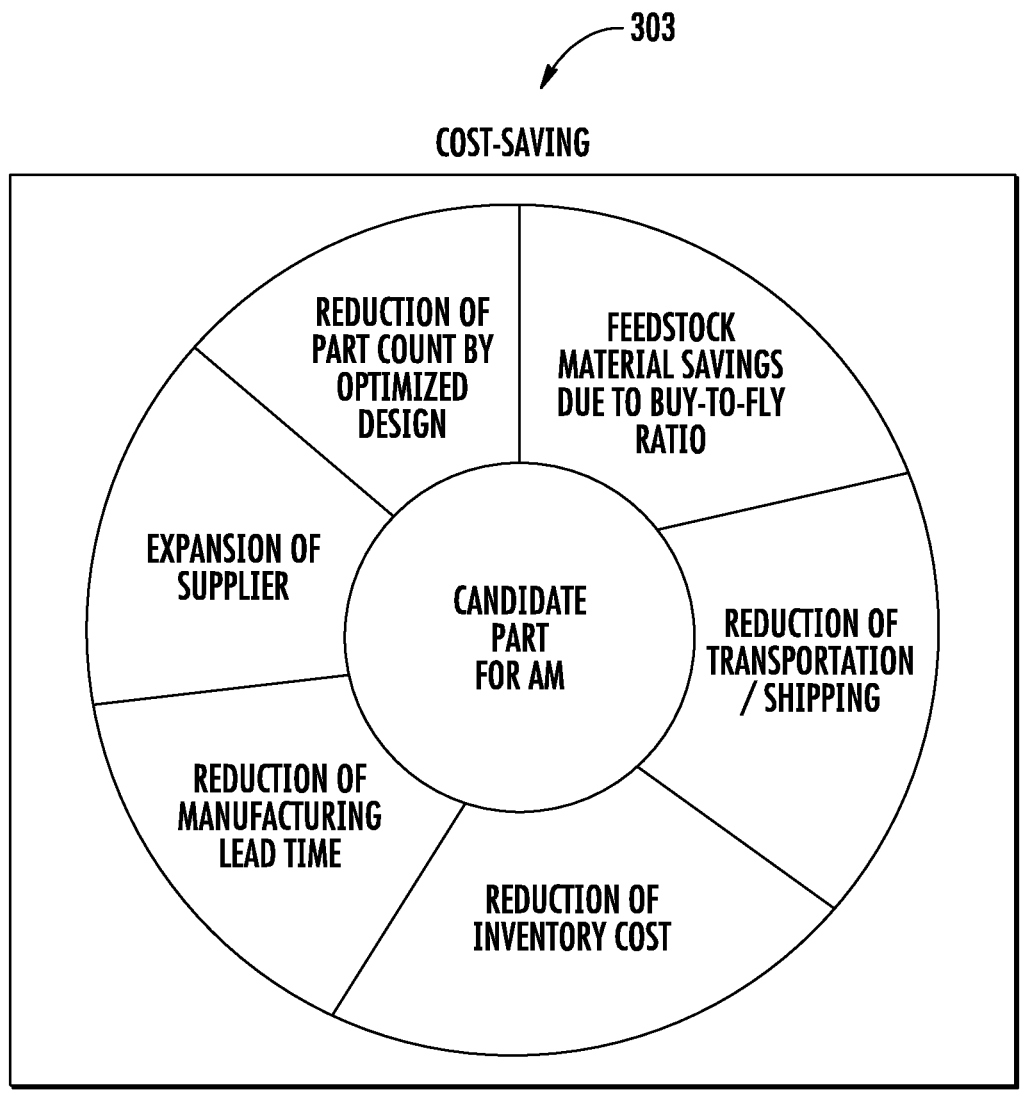

FIGS. 3A-3C illustrate additional assessments (or additional quester modules) in the group 200, according to various example implementations. As shown, FIG. 3A illustrates a supply chain quester module 301 of supply chain operations of the vehicle part. The supply chain quester module 301 includes multiple factors or considerations, such as order received for AM part and AM all parts catalogue. Similarly, FIG. 3B illustrates an on-demand quester module 302 of demand for utilizing AM to manufacture the vehicle part. Furthermore, FIG. 3C illustrates a cost-saving quester module 303 of cost of utilizing AM to manufacture the vehicle part. The evaluation module 1052 may implement an evaluation using one or more of the additional quester module assessments 301-303 separately or combined with the assessments shown in FIG. 2 to produce the measure of appropriateness of AM to manufacture a vehicle part of the vehicle.

Figure 4:
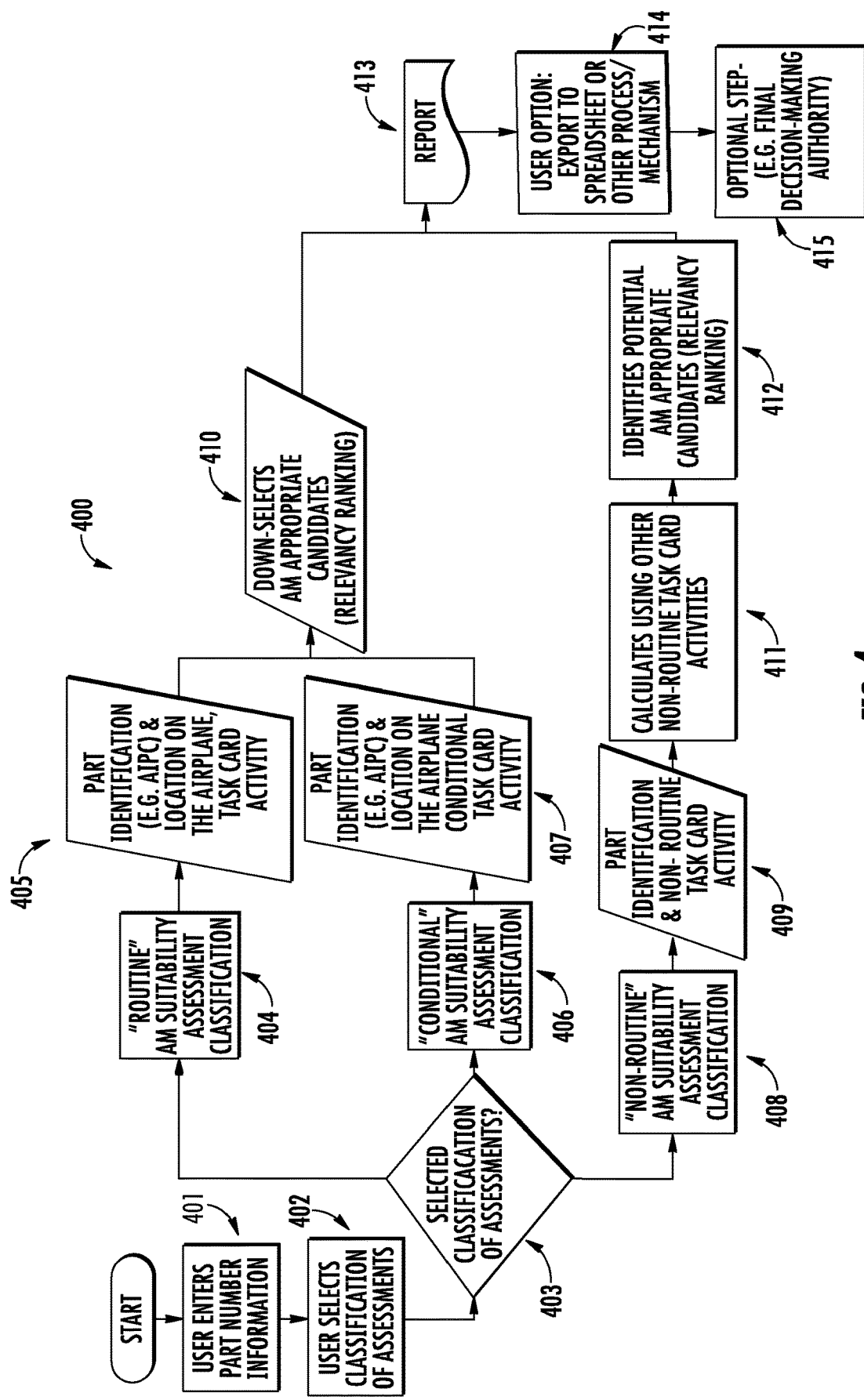
FIG. 4 is a flowchart illustrating various steps in a method of evaluating a measure of appropriateness of AM to manufacture a vehicle part of a vehicle based on selection of a classification of assessments, according to various example implementations.

FIG. 4 is a flowchart illustrating various steps in a method 400 of evaluating a measure of appropriateness of AM to manufacture a vehicle part of a vehicle based on classifications of assessments, according to various example implementations. In the example shown in FIG. 4, the vehicle is an aircraft. As shown, a user enters part number information of the aircraft parts at block 401 and selects a classification of the assessments (quester modules) at block 402. At block 403, a decision is made for the selected classification of assessments (quester modules) per the user selection (i.e., the user request described above for FIG. 1).

If the first classification for routine assessments is selected, the method 400 proceeds to block 404. The routine assessments may indicate a predefined selection of the plurality of assessments. For example, the routine assessments may indicate that assessments of quester modules 201, 202 and 203 shall be performed. At block 405, data of part identification such as aircraft illustrated parts catalog (AIPC), location on the airplane and the task card activity are retrieved by the DMS 104 in response to the user request. At block 410, the evaluation module 1052 produces the measure of appropriateness (e.g., the relevance index or a ranking) based on the predefined selection of the plurality of assessments on the data retrieved from the composite dataset 1031, as described above. In one example, the evaluation module down-selects appropriate candidate parts for AM from the output of the quester modules 201-203. A report is generated at block 413. Optionally, the report can be exported to spreadsheet or other process/mechanism at block 414. Also, an authority can make a final decision to decide whether to utilize AM to manufacture the aircraft part based on the measure of appropriateness at block 415.

If the second classification for conditional assessments based on a condition of the aircraft part is selected, the method 400 proceeds to block 406. The conditional assessments may indicate a selection of the plurality of assessments based on a condition of the aircraft part. At block 407, data of part identification, location on the airplane and conditional task card activity are retrieved by the DMS 104 in response to the user request, similar to block 405. Then, the method 400 proceeds from block 407 to block 410. The steps of 410 and 413-415 are the same as described above for the first classification.

If the third classification for non-routine assessments based on an event of the aircraft part is selected, the method 400 proceeds to block 408. The non-routine assessments may indicate a selection of the plurality of assessments based on an unusual event of the aircraft part. At block 409, data associated with part identification and non-routine task card activity are retrieved. At block 411, the evaluation module 1052 calculates the measure using non-routine task card activities. At block 412, the evaluation module identifies potential appropriate candidate parts for AM. Then the method 400 proceeds from block 412 to block 413. The steps from 413 to 415 are the same as described above for the first or the second classification.

Figure 5:
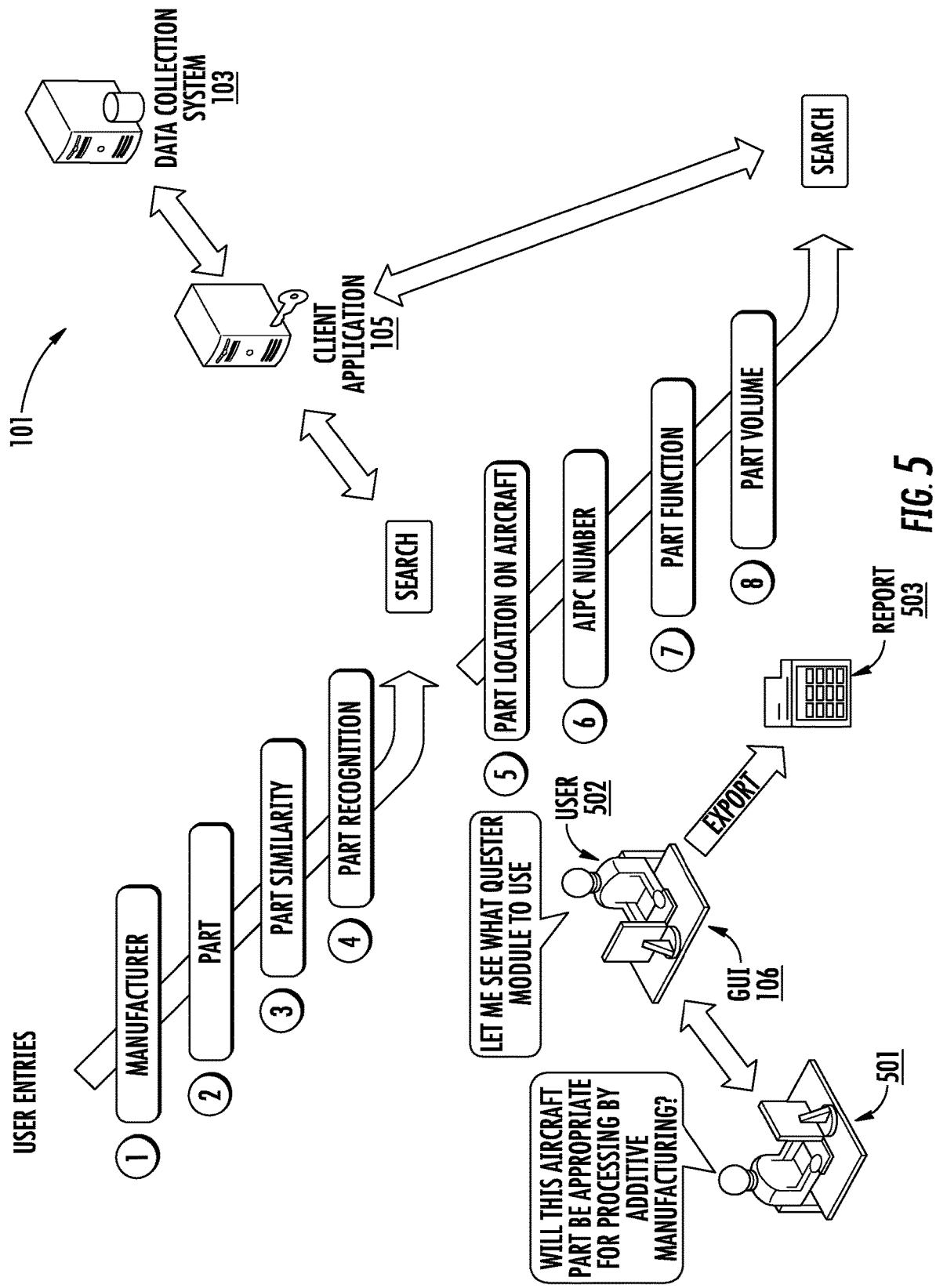
FIG. 5 illustrates producing a report using a graphical user interface (GUI) in response to a user request, according to various example implementations.

FIG. 5 illustrates the computer system 101 producing a report using the GUI 106 in response to a user request, according to various example implementations. In the example shown in FIG. 5, the vehicle is an aircraft. As shown, an airplane operator 501 can send a message to a user 502 of the computer system 101 requesting a measure of appropriateness of AM to manufacture an aircraft part of the aircraft during a lifecycle of the aircraft. The user can use the GUI 106 to input a request including manufacturer, part, part similarity or part recognition. The user request may also include part location on aircraft, AIPC number, part function or part volume. The client application 105 can interpret the user request to retrieve data from the data collection system 103 and produce the measure of appropriateness using an evaluation of a plurality of assessments performed by the quester modules 1051 on the data retrieved, as described above. The user can use the GUI 106 to generate a report 503 including the measure of appropriateness.

FIG. 6 illustrates using the GUI 106 to display the report 503 including the measure of appropriateness, according to various example implementations. As shown in FIG. 6, the GUI can be a web interface. The report can show the measure of appropriateness based on a plurality of assessments performed by multiple quester modules or based on one assessment performed by one quester module. For example, the report can show part details 601 including part number, current fabrication details, similar part number and AM part fabrication details. The report can also show AM part fabrication 602, cost/schedule benefit evaluation 603 and AM appropriateness ranking relevancy 604. In one example, the AM part fabrication 602 may include AM processing code available (Y/N), materials available, AM equipment available. In one example, the cost/schedule benefit evaluation 603 may include cost savings and schedule savings.

Figure 7:
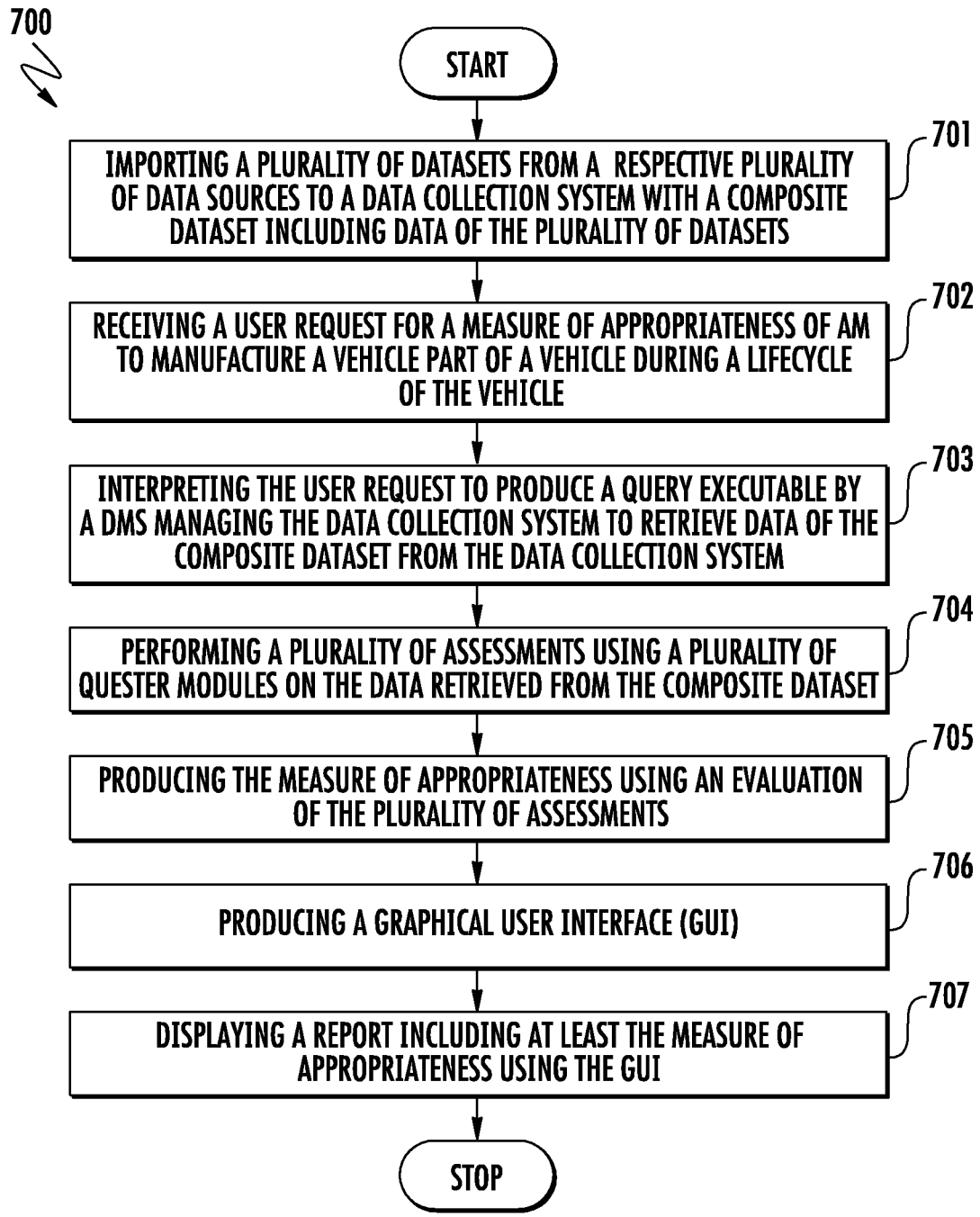
FIG. 7 is a flowchart illustrating various steps in a method of evaluating a measure of appropriateness of AM to manufacture a vehicle part of a vehicle, according to various example implementations.

FIG. 7 is a flowchart illustrating various steps in a method 700 of evaluating a measure of appropriateness of AM to manufacture a vehicle part of a vehicle, according to various example implementations. As shown, at block 701, the method includes importing a plurality of datasets from a respective plurality of data sources, e.g., the data sources 111-116, to a data collection system 103 with a composite dataset 1031 including data of the plurality of datasets.

At block 702, the method 700 includes receiving a user request for a measure of appropriateness of AM to manufacture the vehicle part of the vehicle during a life-cycle of the vehicle. At block 703, the method includes interpreting the user request to produce a query executable by a DMS 104 managing the data collection system 103 to retrieve data of the composite dataset 1031 from the data collection system 103.

At block 704, the method 700 includes performing a plurality of assessments using a plurality of quester modules 1051 on the data retrieved from the composite dataset 1031.

At block 705, the method includes producing the measure of appropriateness using an evaluation of the plurality of assessments. The method also includes producing a GUI 106 at block 706 and displaying a report including at least the measure of appropriateness using the GUI 106 at block 707. In one example, the report may indicate the suitability of utilizing AM to manufacture the vehicle part under a particular context indicated.

According to example implementations of the present disclosure, the computer system 101 may be implemented by various means. Means for implementing the computer system may include hardware, alone or under direction of one or more computer programs from a computer-readable storage medium. In some examples, one or more apparatuses may be configured to function as or otherwise implement the computer system shown and described herein. In examples involving more than one apparatus, the respective apparatuses may be connected to or otherwise in communication with one another in a number of different manners, such as directly or indirectly via a wired or wireless network or the like.

FIG. 8 illustrates an apparatus 800 according to some example implementations. Generally, an apparatus of exemplary implementations of the present disclosure may comprise, include or be embodied in one or more fixed or portable electronic devices. Examples of suitable electronic devices include a smartphone, tablet computer, laptop computer, desktop computer, workstation computer, server computer or the like. The apparatus may include one or more of each of a number of components such as, for example, processor 801 (e.g., processing circuitry) connected to a memory 802 (e.g., storage device).

The processor 801 may be composed of one or more processors alone or in combination with one or more memories. The processor is generally any piece of computer hardware that is capable of processing information such as, for example, data, computer programs and/or other suitable electronic information. The processor is composed of a collection of electronic circuits some of which may be packaged as an integrated circuit or multiple interconnected integrated circuits (an integrated circuit at times more commonly referred to as a "chip"). The processor may be configured to execute computer programs, which may be stored onboard the processor or otherwise stored in the memory 802 (of the same or another apparatus).

The processor 801 may be a number of processors, a multi-core processor or some other type of processor, depending on the particular implementation. Further, the processor may be implemented using a number of heterogeneous processor systems in which a main processor is present with one or more secondary processors on a single chip. As another illustrative example, the processor may be a symmetric multi-processor system containing multiple processors of the same type. In yet another example, the processor may be embodied as or otherwise include one or more ASICs, FPGAs or the like. Thus, although the processor may be capable of executing a computer program to perform one or more functions, the processor of various examples may be capable of performing one or more functions without the aid of a computer program. In either instance, the processor may be appropriately programmed to perform functions or operations according to example implementations of the present disclosure.

The memory 802 is generally any piece of computer hardware that is capable of storing information such as, for example, data, computer programs (e.g., computer-readable program code 803) and/or other suitable information either on a temporary basis and/or a permanent basis. The memory may include volatile and/or non-volatile memory, and may be fixed or removable. Examples of suitable memory include random access memory (RAM), read-only memory (ROM), a hard drive, a flash memory, a thumb drive, a removable computer diskette, an optical disk, a magnetic tape or some combination of the above. Optical disks may include compact disk—read only memory (CD-ROM), compact disk—read/write (CD-R/W), DVD or the like. In various instances, the memory may be referred to as a computer-readable storage medium. The computer-readable storage medium is a non-transitory device capable of storing information, and is distinguishable from computer-readable transmission media such as electronic transitory signals capable of carrying information from one location to another. Computer-readable medium as described herein may generally refer to a computer-readable storage medium or computer-readable transmission medium.

In addition to the memory 802, the processor 801 may also be connected to one or more interfaces for displaying, transmitting and/or receiving information. The interfaces may include a communications interface 804 (e.g., communications unit) and/or one or more user interfaces. The communications interface may be configured to transmit and/or receive information, such as to and/or from other apparatus(es), network(s) or the like. The communications interface may be configured to transmit and/or receive information by physical (wired) and/or wireless communications links. Examples of suitable communication interfaces include a network interface controller (NIC), wireless NIC (WNIC) or the like.

The user interfaces may include a display 806 and/or one or more user input interfaces 805 (e.g., input/output unit). The display may be configured to present or otherwise display information to a user, suitable examples of which include a liquid crystal display (LCD), light-emitting diode display (LED), plasma display panel (PDP) or the like. The user input interfaces may be wired or wireless, and may be configured to receive information from a user into the apparatus, such as for processing, storage and/or display. Suitable examples of user input interfaces include a microphone, image or video capture device, keyboard or keypad, joystick, touch-sensitive surface (separate from or integrated into a touchscreen), biometric sensor or the like. The user interfaces may further include one or more interfaces for communicating with peripherals such as printers, scanners or the like. In some examples, the user interfaces include the GUI 106.

As indicated above, program code instructions may be stored in memory, and executed by processor that is thereby programmed, to implement functions of the systems, subsystems, tools and their respective elements described herein. As will be appreciated, any suitable program code instructions may be loaded onto a computer or other programmable apparatus from a computer-readable storage medium to produce a particular machine, such that the particular machine becomes a means for implementing the functions specified herein. These program code instructions may also be stored in a computer-readable storage medium that can direct a computer, a processor or other programmable apparatus to function in a particular manner to thereby generate a particular machine or particular article of manufacture. The instructions stored in the computer-readable storage medium may produce an article of manufacture, where the article of manufacture becomes a means for implementing functions described herein. The program code instructions may be retrieved from a computer-readable storage medium and loaded into a computer, processor or other programmable apparatus to configure the computer, processor or other programmable apparatus to execute operations to be performed on or by the computer, processor or other programmable apparatus.

Retrieval, loading and execution of the program code instructions may be performed sequentially such that one instruction is retrieved, loaded and executed at a time. In some example implementations, retrieval, loading and/or execution may be performed in parallel such that multiple instructions are retrieved, loaded, and/or executed together. Execution of the program code instructions may produce a computer-implemented process such that the instructions executed by the computer, processor or other programmable apparatus provide operations for implementing functions described herein.

Execution of instructions by a processor, or storage of instructions in a computer-readable storage medium, supports combinations of operations for performing the specified functions. In this manner, an apparatus 800 may include a processor 801 and a computer-readable storage medium or memory 802 coupled to the processor, where the processor is configured to execute computer-readable program code 803 stored in the memory. It will also be understood that one or more functions, and combinations of functions, may be implemented by special purpose hardware-based computer systems and/or processors which perform the specified functions, or combinations of special purpose hardware and program code instructions.

Figure 9:
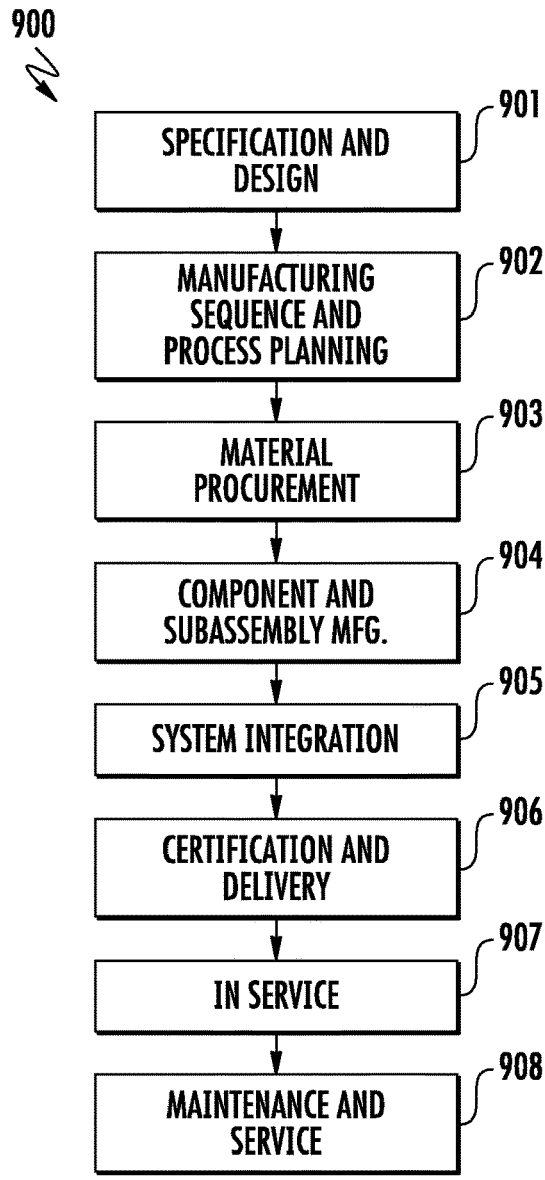
FIG. 9 is an illustration of a flow diagram of aircraft lifecycle according to one example implementation.
Figure 10:
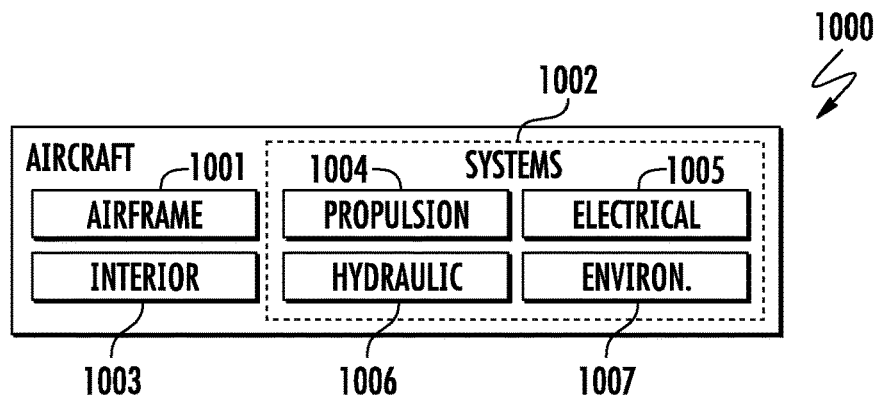
FIG. 10 is an illustration of a block diagram of an aircraft according to one example implementation.

Example implementations of the disclosure may find use in a variety of potential applications, particularly in the transportation industry, including for example, aerospace, marine and automotive applications. Thus, referring now to FIGS. 9 and 10, example implementations may be used in the context of an aircraft manufacturing and service method 900 as shown in FIG. 9, and an aircraft 1000 as shown in FIG. 10. During pre-production, the example method 900 may include specification and design 901 of the aircraft 1000, manufacturing sequence and process planning 902 and material procurement 903. During production, component and subassembly manufacturing 904 and system integration 905 of the aircraft 1000 takes place. Thereafter, the aircraft 1000 may go through certification and delivery 906 in order to be placed in service 907. While in service 907 by a customer, the aircraft 1000 may be scheduled for maintenance and service 908 (which may also include modification, reconfiguration, refurbishment or the like).

The disclosed method and system may be used in the design 901, manufacturing 902, in-service 907, or during the maintenance and service 908 of the aircraft. More specifically, for example, the system and method may be used to produce the measure of appropriateness of AM to manufacture one or more aircraft parts of the aircraft using an evaluation of a plurality of assessments on the data retrieved from the composite dataset 1031. Depending on the measure of appropriateness, AM may be used to manufacture the aircraft part(s) during pre-production, production and/or post-production of the aircraft, such as during any one or more of manufacturing, in-service, or maintenance and service of the aircraft.

Each of the processes of the example method 900 may be performed or carried out by a system integrator, third party and/or operator (e.g., customer). For the purposes of this description, a system integrator may include for example any number of aircraft manufacturers and major-system subcontractors; a third party may include for example any number of vendors, subcontractors and suppliers; and an operator may include for example an airline, leasing company, military entity, service organization or the like.

As shown in FIG. 10, an example aircraft 1000 produced by the example method 900 may include an airframe 1001 with a plurality of systems 1002 and an interior 1003. Examples of high-level systems 1002 include one or more of a propulsion system 1004, electrical system 1005, hydraulic system 1006, environmental system 1007 or the like. Any number of other systems 1002 may be included. In view of a complex system such as an aircraft which includes a large number of components, subsystems and parts; the example implementations may not only lessen the time required to review the large amounts of aircraft part information, but may also lessen the time required and ease the difficulty determining the appropriateness of using additive manufacturing, and studying the information to understand the ways in which the complex system and its elements relate to each other.

Example implementations of the present disclosure may be used in any one or more of these high-level systems, and include evaluating a measure of appropriateness of additive manufacturing to manufacture one or more aircraft parts of the aircraft, and its suitability for a particular context of the airplane. Based on the appropriateness, AM can then be used to manufacture the aircraft part(s). Although an aerospace example is shown, the principles of the disclosure may be applied to other industries, such as the marine and automotive industries. Also, the principles of the disclosure may be applied to medical industry including but not limited to dentistry and manufacturing of prosthetics.

Many modifications and other implementations of the disclosure set forth herein will come to mind to one skilled in the art to which the disclosure pertains having the benefit of the teachings presented in the foregoing description and the associated drawings. Therefore, it is to be understood that the disclosure is not to be limited to the specific implementations disclosed and that modifications and other implementations are intended to be included within the scope of the appended claims. Moreover, although the foregoing description and the associated drawings describe example implementations in the context of certain example combinations of elements and/or functions, it should be appreciated that different combinations of elements and/or functions may be provided by alternative implementations without departing from the scope of the appended claims. In this regard, for example, different combinations of elements and/or functions than those explicitly described above are also contemplated as may be set forth in some of the appended claims. Although specific terms are employed herein, they are used in a generic and descriptive sense only and not for purposes of limitation.

What is claimed is:

1. A computer system for evaluating a measure of appropriateness of additive manufacturing (AM) to manufacture a vehicle part of a vehicle, comprising:
    a memory configured to store computer-readable program code; and
    a processor configured to access the memory, and execute the computer-readable program code to cause the computer system to at least:
    import a plurality of datasets from a respective plurality of data sources to a data collection system with a composite dataset including data of the plurality of datasets;
    receive a user request for the measure of appropriateness of AM to manufacture the vehicle part of the vehicle during a lifecycle of the vehicle;

interpret the user request to produce a query executable by a dataset manager system (DMS) managing the data collection system to retrieve data of the composite dataset from the data collection system;

perform a plurality of assessments using a plurality of quester modules on the data retrieved from the composite dataset, the plurality of assessments including a similarity assessment of similarity of the vehicle part with other vehicle parts, an AM adaptability assessment, and a part fabrication assessment of technical capability of utilizing AM to manufacture the vehicle part;

produce the measure of appropriateness using an evaluation of the plurality of assessments, the plurality of assessments producing respective nominal factors, on which appropriateness of AM to manufacture the vehicle part depends, and the measure of appropriateness including a suitability of utilizing AM to manufacture the vehicle part, the suitability indicated by a relevancy index that is a summation of the respective nominal factors from the plurality of assessments;

produce a graphical user interface;

display a report including at least the measure of appropriateness using the graphical user interface, wherein the user request includes a classification of the plurality of assessments selected from the group consisting of: a first classification for routine assessments indicating a predefined selection of the plurality of assessments, a second classification for conditional assessments indicating a selection of the plurality of assessments based on a condition of the vehicle part, and a third classification for conditional assessments indicating a selection of the plurality of assessments based on an unusual event of the vehicle part, and wherein the computer system is caused to produce the measure of appropriateness according to the first classification, the second classification, or the third classification in the user request; and facilitate manufacture of the vehicle part using AM based on the measure of appropriateness.

2. The computer system of claim 1, wherein the composite dataset includes at least a set of parameters for the plurality of assessments and part identification information that describes vehicle parts of the vehicle including at least part numbers, illustrated parts catalogue, and locations of the vehicle parts on the vehicle.

3. The computer system of claim 2, wherein the computer system caused to interpret the user request includes the computer system caused to interpret the user request to produce the query that identifies the vehicle part based on the part identification information, the query being executable by the DMS to retrieve data of the composite dataset according thereto, and wherein the computer system caused to produce the measure of appropriateness includes the computer system caused to produce the measure of appropriateness using the set of parameters.

4. The computer system of claim 1, wherein the computer system caused to import the plurality of datasets includes the computer system caused to import the plurality of datasets from the respective plurality of data sources including data sources for vehicle operators, vehicle manufacturers, part designers, material manufacturers, part fabricators, equipment designers/makers, part suppliers, maintenance providers, repair providers, over-haulers, part post-market suppliers, and retrofitters.

5. The computer system of claim 1, wherein the computer system caused to receive the user request includes the computer system caused to receive the user request indicating a selection of the plurality assessments from a group including a larger plurality of assessments that are available to produce the measure of appropriateness.

6. The computer system of claim 1, wherein the computer system is caused to produce the measure of appropriateness in which the summation is a weighted summation of the respective nominal factors from the plurality of assessments.

7. The computer system of claim 1, wherein the computer system is caused to perform the plurality of assessments including the similarity assessment in which the other vehicle parts include successfully AM manufactured vehicle parts.

8. A method of evaluating a measure of appropriateness of additive manufacturing (AM) to manufacture a vehicle part of a vehicle, comprising:

importing a plurality of datasets from a respective plurality of data sources to a data collection system with a composite dataset including data of the plurality of datasets;

receiving a user request for the measure of appropriateness of AM to manufacture the vehicle part of the vehicle during a lifecycle of the vehicle;

interpreting the user request to produce a query executable by a dataset manager system (DMS) managing the data collection system to retrieve data of the composite dataset from the data collection system;

performing a plurality of assessments using a plurality of quester modules on the data retrieved from the composite dataset the plurality of assessments including a similarity assessment of similarity of the vehicle part with other vehicle parts, an AM adaptability assessment and a part fabrication assessment of technical capability of utilizing AM to manufacture the vehicle part;

producing the measure of appropriateness using an evaluation of the plurality of assessments, the plurality of assessments producing respective nominal factors, on which appropriateness of AM to manufacture the vehicle part depends, and the measure of appropriateness including a suitability of utilizing AM to manufacture the vehicle part, the suitability indicated by a relevancy index that is a summation of the respective nominal factors from the plurality of assessments;

producing a graphical user interface;

displaying a report including at least the measure of appropriateness using the graphical user interface, wherein receiving the user request comprises receiving the user request including a classification of the plurality of assessments selected from the group consisting of: a first classification for routine assessments indicating a predefined selection of the plurality of assessments, a second classification for conditional assessments indicating a selection of the plurality of assessments based on a condition of the vehicle part, and a third classification for conditional assessments indicating a selection of the plurality of assessments based on an unusual event of the vehicle part, and wherein producing the measure of appropriateness comprises producing the measure of appropriateness according to the first classification, the second classification or the third classification in the user request; and facilitating manufacture of the vehicle part using AM based on the measure of appropriateness.

9. The method of claim 8, wherein the composite dataset includes at least a set of parameters for the plurality of assessments and part identification information that describes vehicle parts of the vehicle including at least part numbers, illustrated parts catalogue, and locations of the vehicle parts on the vehicle.

10. The method of claim 9, wherein interpreting the user request includes interpreting the user request to produce the query that identifies the vehicle part based on the part identification information, the query being executable by the DMS to retrieve data of the composite dataset according thereto, and wherein producing the measure of appropriateness includes producing the measure of appropriateness using the set of parameters.

11. The method of claim 8, wherein importing the plurality of datasets includes importing the plurality of datasets from the respective plurality of data sources including data sources for vehicle operators, vehicle manufacturers, part designers, material manufacturers, part fabricators, equipment designers/makers, part suppliers, maintenance providers, repair providers, over-haulers, post-market suppliers, and retrofitters.

12. The method of claim 8, wherein receiving the user request includes receiving the user request indicating a selection of the plurality of assessments from a group including a larger plurality of assessments that are available to produce the measure of appropriateness.

13. The method of claim 8, wherein the measure of appropriateness is produced in which the summation is a weighted summation of the respective nominal factors from the plurality of assessments.

14. The method of claim 8, wherein the plurality of assessments that are performed include the similarity assessment in which the other vehicle parts include successfully AM manufactured vehicle parts.

15. A computer-readable storage medium for evaluating a measure of appropriateness of additive manufacturing (AM) to manufacture a vehicle part of a vehicle, the computer-readable storage medium being non-transitory and having computer-readable program code stored therein that in response to execution by a processor, causes a computer system to at least:
   import a plurality of datasets from a respective plurality of data sources to a data collection system with a composite dataset including data of the plurality of datasets;
   receive a user request for the measure of appropriateness of AM to manufacture the vehicle part of the vehicle during a lifecycle of the vehicle;
   interpret the user request to produce a query executable by a dataset manager system (DMS) managing the data collection system to retrieve data of the composite dataset from the data collection system;
   perform a plurality of assessments using a plurality of quester modules on the data retrieved from the composite dataset the plurality of assessments including a similarity assessment of similarity of the vehicle part with other vehicle parts, an AM adaptability assessment and a part fabrication assessment of technical capability of utilizing AM to manufacture the vehicle part;
   produce the measure of appropriateness using an evaluation of the plurality of assessments on the data retrieved from the composite dataset the plurality of assessments producing respective nominal factors, on which appropriateness of AM to manufacture the vehicle part depends, and the measure of appropriateness including a suitability of utilizing AM to manufacture the vehicle part, the suitability indicated by a relevancy index that is a summation of the respective nominal factors from the plurality of assessments;
   produce a graphical user interface;
   display a report including at least the measure of appropriateness using the graphical user interface,
   wherein the user request includes a classification of the plurality of assessments selected from the group consisting of: a first classification for routine assessments indicating a predefined selection of the plurality of assessments, a second classification for conditional assessments indicating a selection of the plurality of assessments based on a condition of the vehicle part, and a third classification for conditional assessments indicating a selection of the plurality of assessments based on an unusual event of the vehicle part, and
   wherein the computer system is caused to produce the measure of appropriateness according to the first classification, the second classification or the third classification in the user request; and
   facilitate manufacture of the vehicle part using AM based on the measure of appropriateness.

16. The computer-readable storage medium of claim 1, wherein the composite dataset includes at least a set of parameters for the plurality of assessments and part identification information that describes vehicle parts of the vehicle including at least part numbers, illustrated parts catalogue, and locations of the vehicle parts on the vehicle.

17. The computer-readable storage medium of claim 16, wherein the computer system being caused to interpret the user request includes being caused to interpret the user request to produce the query that identifies the vehicle part based on the part identification information, the query being executable by the DMS to retrieve data of the composite dataset according thereto, and wherein the computer system being caused to produce the measure of appropriateness includes being caused to produce the measure of appropriateness using the set of parameters.

18. The computer-readable storage medium of claim 1, wherein the computer system being caused to import the plurality of datasets includes being caused to import the plurality of datasets from the respective plurality of data sources including data sources for vehicle operators, vehicle manufacturers, part designers, material manufacturers, part fabricators, equipment designers/makers, part suppliers, maintenance providers, repair providers, over-haulers, post-market suppliers, and retrofitters.

19. The computer-readable storage medium of claim 1, wherein the computer system being caused to receive the user request includes being caused to receive the user request indicating a selection of the plurality of assessments from a group including a larger plurality of assessments that are available to produce the measure of appropriateness.

20. The computer-readable storage medium of claim 1, wherein the computer system is caused to produce the measure of appropriateness in which the summation is a weighted summation of the respective nominal factors from the plurality of assessments.

21. The computer-readable storage medium of claim 1, wherein the computer system is caused to perform the plurality of assessments including the similarity assessment in which the other vehicle parts include successfully AM manufactured vehicle parts.

* * * * *